United States Patent
Dsilva et al.

(10) Patent No.: US 11,397,204 B2
(45) Date of Patent: Jul. 26, 2022

(54) NOISE-INDEPENDENT LOSS CHARACTERIZATION OF NETWORKS

(71) Applicant: Achronix Semiconductor Corporation, Santa Clara, CA (US)

(72) Inventors: Hansel Desmond Dsilva, Thane West (IN); Amit Kumar, Noida (IN)

(73) Assignee: Achronix Semiconductor Corporation, Santa Clara, CA (US)

( * ) Notice: Subject to any disclaimer, the term of this patent is extended or adjusted under 35 U.S.C. 154(b) by 290 days.

(21) Appl. No.: 16/695,743

(22) Filed: Nov. 26, 2019

(65) Prior Publication Data

US 2021/0156897 A1    May 27, 2021

(51) Int. Cl.
*G01R 27/32*    (2006.01)
*G01R 27/06*    (2006.01)

(52) U.S. Cl.
CPC .............. *G01R 27/32* (2013.01); *G01R 27/06* (2013.01)

(58) Field of Classification Search
CPC .................................. G01R 27/32; G01R 27/06
See application file for complete search history.

(56) References Cited

U.S. PATENT DOCUMENTS

| | | | | |
|---|---|---|---|---|
| 7,505,512 B1 * | 3/2009 | Anderson | ......... | H04L 25/03038 375/224 |
| 2005/0093554 A1 | 5/2005 | Wang et al. | | |
| 2005/0240361 A1 | 10/2005 | Loyer | | |
| 2014/0266238 A1 * | 9/2014 | Furse | ..................... | G01R 31/11 324/533 |
| 2018/0131343 A1 * | 5/2018 | Wu | ...................... | H03H 1/0007 |
| 2019/0272306 A1 * | 9/2019 | Howald | .................. | G06F 17/11 |

FOREIGN PATENT DOCUMENTS

| WO | 2018139926 | 8/2018 |
|---|---|---|
| WO | WO-2021108013 A1 | 6/2021 |

OTHER PUBLICATIONS

Kurokawa, K., "Power Waves and the Scattering Matrix", IEEE Transactions on Microwave Theory and Techniques, vol. 13, No. 2, Mar. 1965., pp. 194-202.

(Continued)

*Primary Examiner* — Jeff W Natalini
(74) *Attorney, Agent, or Firm* — Schwegman Lundberg & Woessner, P.A.

(57) ABSTRACT

An S-parameter of a reference impedance is determined and converted to a desired mode of operation. Example modes of operation include a single-ended input output mode, a differential input output mode, and a common input output mode. The complex values of the impedance at each port as a function of frequency can be computed using the novel closed-form quadratic S-parameter equation which utilizes the concept of matched networks by setting the reflections and re-reflections to zero through S-parameter renormalization. Using the S-parameter renormalization, the insertion loss corresponding to zero reflections and re-reflections is calculated. Based on the determination of the matching impedance used to reduce the reflections and re-reflections to zero, a parameter of a circuit comprising the network may be modified to reduce noise.

20 Claims, 9 Drawing Sheets

(56) References Cited

OTHER PUBLICATIONS

"International Application Serial No. PCT US2020 051789, International Search Report dated Jan. 13, 2021", 2 pgs.
"International Application Serial No. PCT US2020 051789, Written Opinion dated Jan. 13, 2021", 7 pgs.
Hranac, "A Quick Look at S-Parameters", In: Broadband Library, Retrieved on Dec. 2, 2020 (Dec. 2, 2020) fromhttps: broadbandlibrary. com a-quick-look-at-s-parameters entire document, (Nov. 18, 2019), 10 pgs.
Poole, "The Smith Chart", In: Microwave Active Circuit Analysis and Design, Retrieved on Dec. 2, 2020 (Dec. 2, 2020) fromhttps: www.sciencedirect.com topics engineering smith-chart entire document, (2016), 25 pgs.
Zaki, "AC characterization of organic thin-film transistors with asymmetric gate-to-source and gate-to-drain overlaps", In: Organic Electronics, Retrieved onDec. 2, 2020 (Dec. 2, 2020) fromhttps: www.fkf.mpg.de 6649565 Zaki-OrgElectronics-2013-1318.pdf entire document, (Mar. 4, 2013), 5 pgs.
"International Application Serial No. PCT/US2020/051789, International Preliminary Report on Patentability dated Jun. 9, 2022", 9 pgs.

\* cited by examiner

NOISE-INDEPENDENT LOSS CHARACTERIZATION OF NETWORKS

BACKGROUND

Network analyzers are used to determine scattering parameters, or S-parameters, of a network. An S-parameter is defined in terms of the incident and reflected waves at the ports of the network, wherein the driving port has a sinusoidal source with a series impedance and the load port is terminated with a load impedance. This convention allows the S-parameters to be utilized for high frequency measurements, since they do not require open circuit or short circuit conditions for network characterization, in contrast to other network parameters such as Y-parameters, Z-parameters, H-parameters, T-parameters, or ABCD-parameters.

An S-parameter is a three-dimensional matrix consisting of complex numbers where the number of rows and columns is equal to the number of network ports of the network and the third dimension is the frequency axis. For example, a two-port network consisting of an input and output port characterized over a frequency sweep from 10 MHz to 60 GHz in steps of 10 MHz yields an S-parameter that is a three-dimensional matrix of size 2×2×6000. The S-parameter may be used to characterize the network for a single-ended input-output mode, a differential input-output mode, a common input-output mode, and a mode conversion mode of operation. The S-parameter is used to help understand the reflection, insertion loss, and crosstalk associated with a network.

The S-parameter characterizes a network through a Vector Network Analyzer (VNA) by measuring the incident and reflected voltage and current waves. The VNA is used for calculating the S-parameter of a network. For a two-port network, the diagonal elements of an S-parameter give the reflection coefficient while the off-diagonal terms give the transmission coefficient. The reflection coefficients captured using a VNA instrument are those captured at the input and output terminal of the network.

A time domain reflectometer instrument utilizes time domain reflectometry (TDR) for network characterization. The TDR is usually used to capture the reflections along the length of the network at the source and load. Since the TDR captures reflections at a different point in the network than the VNA, it is difficult to relate the reflections in the frequency domain (as captured by the VNA) to those in the time domain (as captured by the TDR). This applies to both S-parameters generated through simulation and those generated by measurement.

While the TDR instrument offers an easy way of interpreting the reflections along a network, the cost of a TDR instrument is very significant. This puts a strain on printed circuit board (PCB) manufactures in having to not only purchase a VNA but also a TDR instrument. The TDR instrument has its limitation in resolving reflections given its inability to detect noise below −60 dB in magnitude when compared to a VNA instrument which has a noise floor in the −100 dB range (10,000 times more sensitive). Further, the TDR methodology (whether through simulation or measurement) requires a very fast rise time which may not be realizable when it comes to resolving the reflections of a short length network especially vias. A via is a small opening in an oxide layer that allows for a circuit connection between two layers of a PCB.

The complex reflection coefficient of the network and the complex characteristic impedance of the network are interrelated. As a result, it is difficult to determine either when both are unknown. There have been attempts to relate the reflections captured in the time domain using a TDR to reflections in the frequency domain, but these attempts have not been successful. Simplifying assumptions such as assuming constant real impedance as a function of frequency prove to be disastrous, many times resulting in breaking the physics of the network. This in turn puts a constraint on modelling capability in a simulation environment, since many network parameters are frequency dependent and little information can be gathered from the time domain measurements (or simulated results) of the TDR.

BRIEF DESCRIPTION OF THE DRAWINGS

Some embodiments of the disclosed technology are illustrated by way of example and not limitation in the figures of the accompanying drawings.

DETAILED DESCRIPTION

Example methods, systems and circuits for characterizing loss independent of noise due to reflections and re-reflections coming from the transmitter and the receiver will now be described. In the following description, numerous examples having example-specific details are set forth to provide an understanding of example embodiments. It will be evident, however, to one of ordinary skill in the art that these examples may be practiced without these example-specific details, and/or with different combinations of the details than are given here. Thus, specific embodiments are given for the purpose of simplified explanation, and not limitation.

An S-parameter of a reference impedance is determined and converted to a desired mode of operation. Example modes of operation include a single-ended input output mode, a differential input output mode, and a common input output mode. For the differential or common input output modes of operation, this may mean converting the S-parameter to a mixed mode format and extracting the desired mode from the mixed mode format.

The complex values of the impedance at each port as a function of frequency can be computed using the novel closed-form quadratic S-parameter equation which utilizes the concept of matched networks by setting the reflections and re-reflections to zero through S-parameter renormalization. Using the S-parameter renormalization, the insertion loss corresponding to zero reflections and re-reflections is calculated. The insertion loss corresponding to zero reflections and re-reflections due to input and output port termination is termed the effective insertion loss (EIL) of the network.

Based on the EIL, a quality metric for interconnects may be derived. The quality metric may be used to automatically reject low-quality devices. Alternatively, based on the determination of the matching impedance used to reduce the reflections and re-reflections to zero, a parameter of a circuit comprising the network may be modified to reduce noise. The EIL may also be used in designing matching networks (e.g., to aid in designing filters, power amplifiers, termination networks, and the like).

Figure 1:
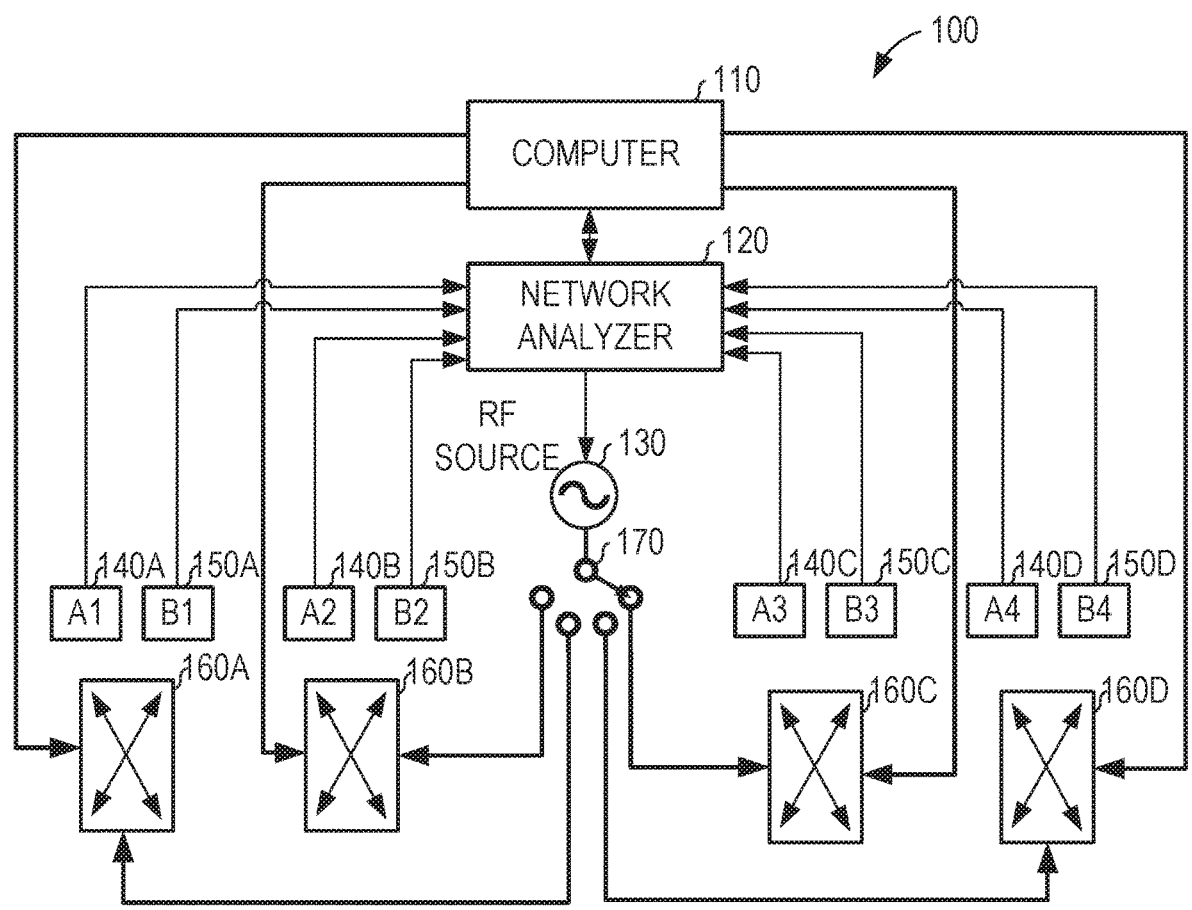
FIG. 1 is a high-level diagrammatic view of a system that interfaces with networks and analyzes the networks, according to some example embodiments.

FIG. 1 is a high-level diagrammatic view 100 of a system comprising the computer 110 and the VNA 120 that interfaces with networks and analyzes the networks, according to some example embodiments. In the example of FIG. 1, the networks 160A, 160B, 160C, and 160D are being analyzed by the VNA 120. The computer 110 may be an external computer controlling the VNA 120 or a computer integrated with the VNA 120. Probes 140A, 150A, 140B, 150B, 140C, 150C, 140D, and 150D of the VNA 120 are connected to the networks 160A-160D.

By interpreting the data received from the VNA 120 based on the measurements from the probes 140A-140D and 150A-150D, the computer 110 determines parameters of the networks 160A-160D. Each of the probes 140A-140D is connected to an input port of the corresponding one of the networks 160A-160D. Likewise, each of the probes 150A-150D is connected to an output port of the corresponding one of the networks 160A-160D.

The radio-frequency (RF) source 130 provides an input signal to any one of the networks 160A-160B, as controlled by the switch 170. The frequency of the RF source 130 (also referred to as an alternating current (AC) source) is controlled by the VNA 120.

Each of the networks 160A-160D is an arbitrary network of any reference impedance. The characterized network measurement performed by the VNA 120 is at the reference plane at the tips of the probes 140A-140D and 150A-150D.

Figure 2:
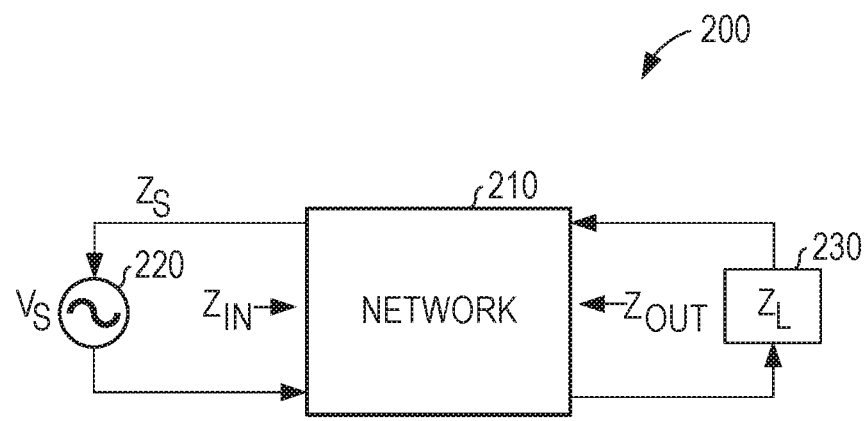
FIG. 2 is a high-level diagrammatic view of a network with two ports, according to some example embodiments.

FIG. 2 is a high-level diagrammatic view 200 of a network 210 with two ports, according to some example embodiments. The input port is connected to a source 220 and the output port is connected to a load 230. The source 220 has a characteristic impedance $Z_S$. The load 230 has a characteristic impedance $Z_L$.

For a particular operating frequency, the S-parameter of the internals of the network can be written as $$\begin{bmatrix} S_{11} & S_{12} \\ S_{21} & S_{21} \end{bmatrix}.$$

The network has an input reflection coefficient $\rho_{in}$ and an output reflection coefficient $\rho_{out}$. The input reflection coefficient $\rho_{in}$ is measured or calculated by looking into the input port (without a source attached) while the output port of the network is terminated by being connected to the load 230. The output reflection coefficient $\rho_{out}$ is measured or calculated by looking into the output port (without a load attached) while the input port of the network is terminated by being connected to the source 220. $Z_{in}$ is the impedance seen looking into the input port of the terminated network (e.g., with the load 230 in place but disregarding the source 220). $Z_{out}$ is the impedance seen looking into the output port of the terminated network (e.g., with the source 220 in place but disregarding the load 230).

For clarity, the S-parameters of the network as a whole, including the connection impedances, is written with a different notation, $$\begin{bmatrix} s(1,1) & s(1,2) \\ s(2,1) & s(2,2) \end{bmatrix}.$$

The equations below can be used to determine the value of s(1,1) and s(2,2), wherein PI is the load reflection coefficient and $\rho_s$ is the source reflection coefficient. The equations relate the impedance at the ports to the S-parameters.

$$s(1,1) = \rho_{in} = S_{11} + \frac{S_{12}S_{21}\rho l}{1 - S_{22}\rho l} \qquad \text{Equation 1}$$

$$s(2,2) = \rho_{out} = S_{22} + \frac{S_{12}S_{21}\rho s}{1 - S_{11}\rho s} \qquad \text{Equation 2}$$

When the network is matched, $Z_S$ and $Z_L$ are both equal to $Z_C$, the characteristic impedance of the network 210. When the source and load impedances are matched to the characteristic impedance of the network, the additional terms in the equations above that depend on the source and load impedances are reduced to zero. Accordingly, the equations simplify to:

$$s(1,1) = \rho_{in} = S_{11} \qquad \text{Equation 3:}$$

$$s(2,2) = \rho_{out} = S_{22} \qquad \text{Equation 4:}$$

Figure 3:
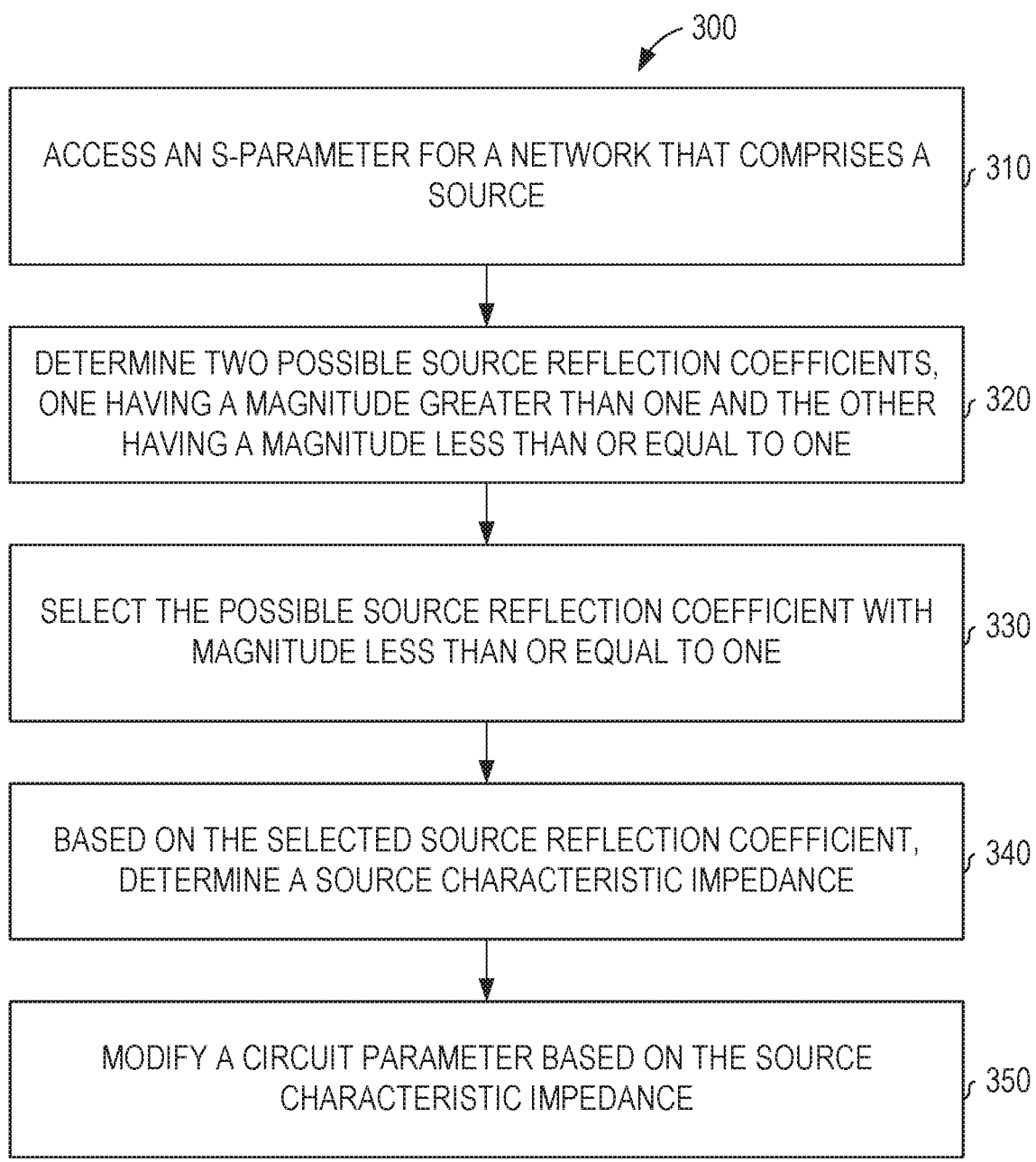
FIG. 3 is a flowchart of a method for determining a source characteristic impedance and modifying a circuit parameter based on the source characteristic impedance, according to some example embodiments.

FIG. 3 is a flowchart of a method 300 for determining a source characteristic impedance and modifying a circuit parameter based on the source characteristic impedance, according to some example embodiments. The method 300 includes operations 310, 320, 330, 340, and 350. By way of example and not limitation, the method 300 is described as being performed by the computer 110 and the VNA 120 of FIG. 1, operating on the network 210 of FIG. 2.

In operation 310, the computer 110 accesses an S-parameter for a network (e.g., the network 210) that comprises a source (e.g., the source 220). The S-parameter may be simulated or measured by the VNA 120.

The computer 110, in operation 320, determines two possible source reflection coefficients. One of the possible source reflection coefficients has a magnitude greater than one and the other has a magnitude less than or equal to one. In some example embodiments, the algorithm described below is used. In this algorithm, S is a complex matrix of size 2×2×n, where n is the number of frequency points. Z0 is a 1×1 complex vector representing the load impedance. The results are Z1, a complex value representing the source impedance, and Z2, a complex value representing the load impedance. The conj( ) function provides the complex conjugate of a complex number. The * operator performs matrix multiplication.

Equation 5

$$a = -S(2, 2, n) + S(1, 1, n) * S(2, 2, n) * conj(S(1, 1, n)) -$$
$$S(1, 2, n) * S(2, 1, n) * conj(S(1, 1n))$$

$$b = 1 + S(2, 2, n) * conj(S(2, 2, n)) + S(1, 1, n) * S(2, 2, n)$$
$$* conj(S(2, 1, n)) * conj(S(1, 2), n)) - S(2, 1, n) * S(1, 2, n)$$
$$* conj(S(2, 1, n)) * conj(S(1, 2, n)) - S(1, 1, n) * S(2, 2, n)$$
$$* conj(S(1, 1, n)) * conj(S(2, 2, n)) + S(1, 2, n) * S(2, 1, n)$$
$$* conj(S(1, 1, n)) * conj(S(2, 2, n)) - S(1, 1, n) * conj(S(1, 1, n))$$

$$c = -conj(S(2, 2, n)) - S(1, 1, n) * conj(S(1, 2, n)) * conj(S(2, 1, n)) +$$
$$S(1, 1, n) * conj(S(1, 1, n)) * conj(S(2, 2, n))$$

$$\rho2_1 = \frac{-b + \sqrt{b^2 - 4ac}}{2a}$$

$$\rho2_2 = \frac{-b - \sqrt{b^2 - 4ac}}{2a}$$

if $|\rho2_1| \leq 1$ && $|\rho2_2| > 1$, $\rho2(n) = \rho2_1$ else $\rho2(n) = \rho2_2$ $$\rho1(n) = conj\left(S(1, 1, n) + \frac{\rho2(n) * S(1, 2, n) * S(2, 1, n)}{1 - \rho2(n) * S(2, 2, n)}\right)$$

$$Z1 = \frac{\rho1(n) * conj(Z0) + Z0}{1 - \rho1(n)}$$

$$Z2 = \frac{\rho2(n) * conj(Z0) + Z0}{1 - \rho2(n)}$$

The algorithm above results from renormalization of the S-parameter. The reflections and re-reflections become zero in a matched network. When the reflections are set to zero, this enables solving for the source and load reflection coefficients. Thus, renormalizing the S-parameter from the original conditions in which the load of Z0 is present to the conditions in which a matched load is present reveals the source and load reflection coefficients. The renormalized S-parameter is given by the following equation, in which S' is the renormalized S-parameter, I is the identity matrix, the $^H$ operator takes the Hermetian transpose of a matrix, $\Gamma$ is a diagonal matrix with the ith diagonal term being $\rho_i(Z_i^*)$, and A is a diagonal matrix with the ith diagonal term being $$\frac{1 - \rho_i^*(Z_i^*)}{|1 - \rho_i(Z_i^*)|}\sqrt{1 - \rho_i(Z_i^*)\rho_i^*(Z_i^*)}.$$

$$S' = A^{-1}(S - \Gamma^H)(I - \Gamma S)^{-1} A^H \qquad \text{Equation 6}$$

The power wave reflection coefficient of the new ith port reference impedance ($Z_i'$) with respect to the complex conjugate of the original ith port reference impedance ($Z_i^*$):

$$\rho_i(Z_i^*) = \frac{Z_i' - Z_i}{Z_i' - Z_i^*} \qquad \text{Equation 7}$$

When dealing with a two-port network, and thus a 2×2 matrix, in the condition of zero reflection, $$S' \stackrel{def}{=} \begin{bmatrix} 0 & S'_{12} \\ S'_{21} & 0 \end{bmatrix}.$$

Also, equation 5 can be expanded:

Equation 8

$$S' =$$

$$\begin{bmatrix} \frac{1 - \rho_1^*(Z_1^*)}{|1 - \rho_1(Z_1^*)|}\sqrt{1 - \rho_1(Z_1^*)\rho_1^*(Z_1^*)} & 0 \\ 0 & \frac{1 - \rho_2^*(Z_2^*)}{|1 - \rho_2(Z_2^*)|}\sqrt{1 - \rho_2(Z_2^*)\rho_2^*(Z_2^*)} \end{bmatrix}^{-1} \cdot$$

$$\left(\begin{bmatrix} S_{11} & S_{12} \\ S_{21} & S_{22} \end{bmatrix} - \begin{bmatrix} \rho_1(Z_1^*) & 0 \\ 0 & \rho_2(Z_2^*) \end{bmatrix}\right)^H \cdot$$

$$\left(\begin{bmatrix} 1 & 0 \\ 0 & 1 \end{bmatrix} - \begin{bmatrix} \rho_1(Z_1^*) & 0 \\ 0 & \rho_2(Z_2^*) \end{bmatrix} \cdot \begin{bmatrix} S_{11} & S_{12} \\ S_{21} & S_{22} \end{bmatrix}\right)^{-1} \cdot$$

$$\begin{bmatrix} \frac{1 - \rho_1^*(Z_1^*)}{|1 - \rho_1(Z_1^*)|}\sqrt{1 - \rho_1(Z_1^*)\rho_1^*(Z_1^*)} & 0 \\ 0 & \frac{1 - \rho_2^*(Z_2^*)}{|1 - \rho_2(Z_2^*)|}\sqrt{1 - \rho_2(Z_2^*)\rho_2^*(Z_2^*)} \end{bmatrix}^H$$

Evaluating equation 8 and applying the fact that $S_{11}$' and $S_{22}$' are both equal to 0 in the condition of zero reflection yields the following equations.

$$(S_{11} - \rho_1^*(Z_1^*))(1 - \rho_2^*(Z_2^*)S_{22}) + \rho_2^*(Z_2^*)S_{12}S_{21} = 0 \qquad \text{Equation 9:}$$

$$(S_{22} - \rho_2^*(Z_2^*))(1 - \rho_1^*(Z_1^*)S_{11}) + \rho_1^*(Z_1^*)S_{12}S_{21} = 0 \qquad \text{Equation 10:}$$

The computer 110 selects the possible source reflection coefficient $\rho_1(Z_1^*)$, with magnitude less than or equal to one (operation 330) and, based on the selected source reflection coefficient, determines a source characteristic impedance (operation 340). In operation 350, the computer 110 modifies a circuit parameter based on the determined source characteristic impedance. For example, an impedance of the load 230 may be adjusted to reduce reflections and re-reflections. As a result of this adjustment, power lost through the network is reduced and clarity of the signal is increased. This may allow the modified circuit to operate at lower power, higher frequency, or both when compared with the unmodified circuit. Thus, another example of a modification of a circuit parameter based on the determined source characteristic impedance is an adjustment of an operating frequency of the network. Yet another advantage of this method is in material characterization in the high-frequency domain, due to the ability to separate transmission loss from noise due to reflections.

Figure 4:
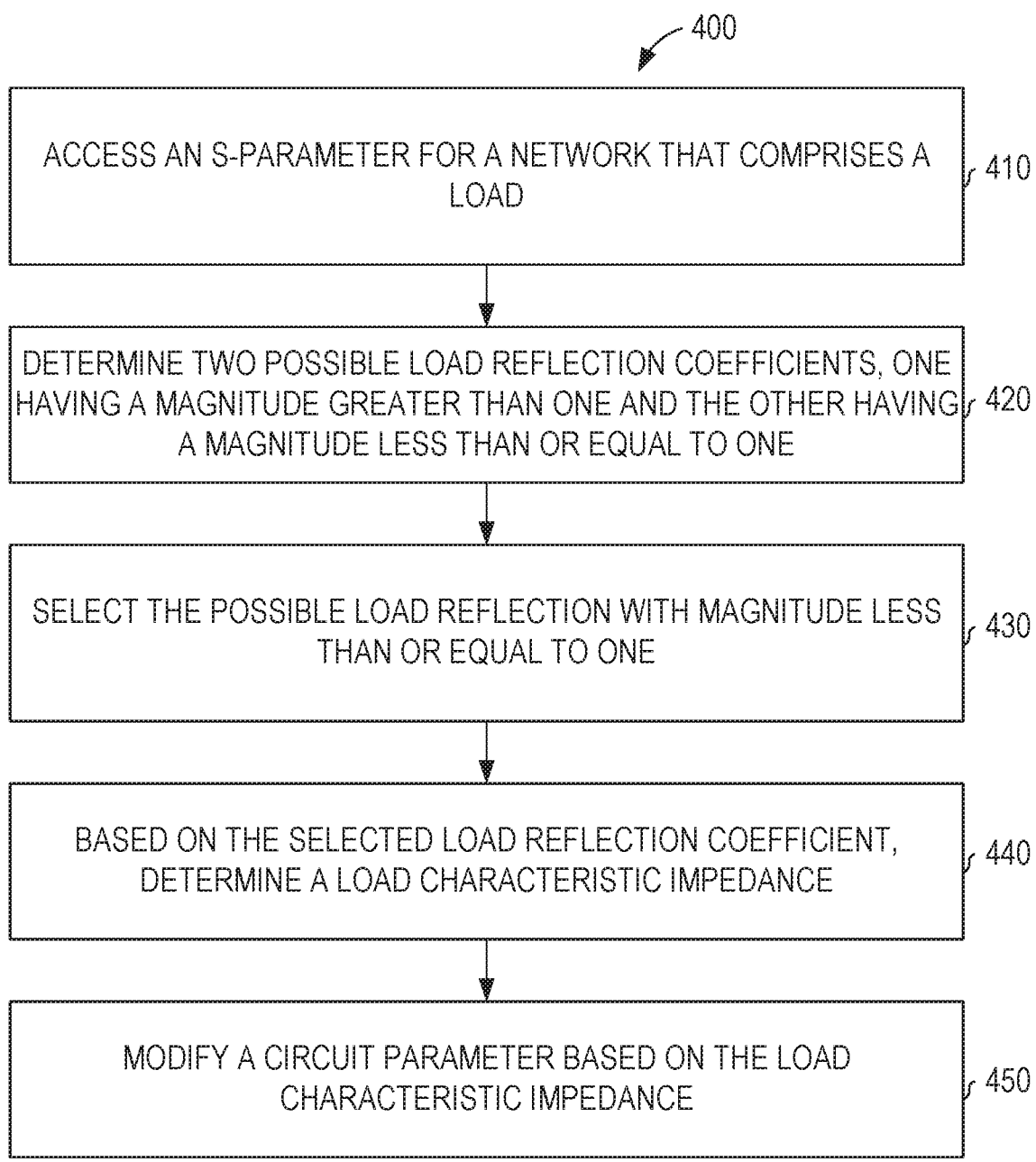
FIG. 4 is a flowchart of a method for determining a load characteristic impedance and modifying a circuit parameter based on the load characteristic impedance, according to some example embodiments.

FIG. 4 is a flowchart of a method for determining a load characteristic impedance and modifying a circuit parameter based on the load characteristic impedance, according to some example embodiments. The method 400 includes operations 410, 420, 430, 440, 450, 460, and 470. By way of example and not limitation, the method 400 is described as being performed by the computer 110 and VNA 120 of FIG. 1, operating on the network 210 of FIG. 2.

In operation 410, the computer 110 accesses an S-parameter for a network (e.g., the network 210) that comprises a load (e.g., the load 230). The S-parameter may be simulated or measured by the VNA 120.

The computer 110, in operation 420, determines two possible load reflection coefficients. One of the possible load reflection coefficients has a magnitude greater than one and the other has a magnitude less than or equal to one. In some example embodiments, the algorithm described below is used. In this algorithm, S is a complex matrix of size 2×2×n, where n is the number of frequency points. Z0 is a 1×1 complex vector representing the source impedance. The results are Z1 and Z2, complex values representing the two possible load reflection coefficients.

Equation 11

$$a = -S(2, 2, n) + S(1, 1, n) * S(2, 2, n) * conj(S(1, 1, n)) - $$
$$S(1, 2, n) * S(2, 1, n) * conj(S(1, 1n)$$

$$b = 1 + S(2, 2, n) * conj(S(2, 2, n)) + S(1, 1, n) * S(2, 2, n)$$
$$* conj(S(2, 1, n)) * conj(S(1, 2), n)) - S(2, 1, n) * S(1, 2, n)$$
$$* conj(S(2, 1, n)) * conj(S(1, 2, n)) - S(1, 1, n) * S(2, 2, n)$$
$$* conj(S(1, 1, n) * conj(S(2, 2, n) + S(1, 2, n) * S(2, 1, n)$$
$$* conj(S(1, 1, n)) * conj(S(2, 2, n)) - S(1, 1, n) * conj(S(1, 1, n))$$

$$c = -conj(S(2, 2, n)) - S(1, 1, n) * conj(S(1, 2, n)) * conj(S(2, 1, n)) + $$
$$S(1, 1, n) * conj(S(1, 1, n)) * conj(S(2, 2, n))$$

$$\rho 2_1 = \frac{-b + \sqrt{b^2 - 4ac}}{2a}$$

$$\rho 2_2 = \frac{-b - \sqrt{b^2 - 4ac}}{2a}$$

if $|\rho 2_1| \le 1$ && $|\rho 2_2| > 1$, $\rho 2(n) = \rho 2_1$ else $\rho 2(n) = \rho 2_2$ $$\rho 1(n) = conj\left(S(1, 1, n) + \frac{\rho 2(n) * S(1, 2, n) * S(2, 1, n)}{1 - \rho 2(n) * S(2, 2, n)}\right)$$

$$Z1 = \frac{\rho 1(n) * conj(Z0) + Z0}{1 - \rho 1(n)}$$

$$Z2 = \frac{\rho 2(n) * conj(Z0) + Z0}{1 - \rho 2(n)}$$

The computer 110 selects the possible load reflection coefficient ($\rho_2(Z_2^*)$) with magnitude less than or equal to one (operation 430) and, based on the selected load reflection coefficient, determines a load characteristic impedance (operation 440). In operation 450, the computer 110 modifies a circuit parameter based on the determined load characteristic impedance. For example, an impedance of the source 220 may be adjusted to reduce reflections and re-reflections. Impedance adjustment may be realized through adjusting a variable resistor, inductor, or capacitor; by using one or more filters; or by using an active matching network. As a result of this adjustment, power lost through the network is reduced and clarity of the signal is increased. This may allow the modified circuit to operate at lower power, higher frequency, greater distance, or any combination thereof when compared with the unmodified circuit. Thus, another example of a modification of a circuit parameter based on the determined load characteristic impedance is an adjustment of an operating frequency of the network.

In some example embodiments, the method 300 and the method 400 are both performed for the same network 210. In these example embodiments, the modification of the circuit parameter in operation 350 or operation 450 may be based on both the determined load characteristic impedance and the determined source characteristic impedance.

Figure 5:
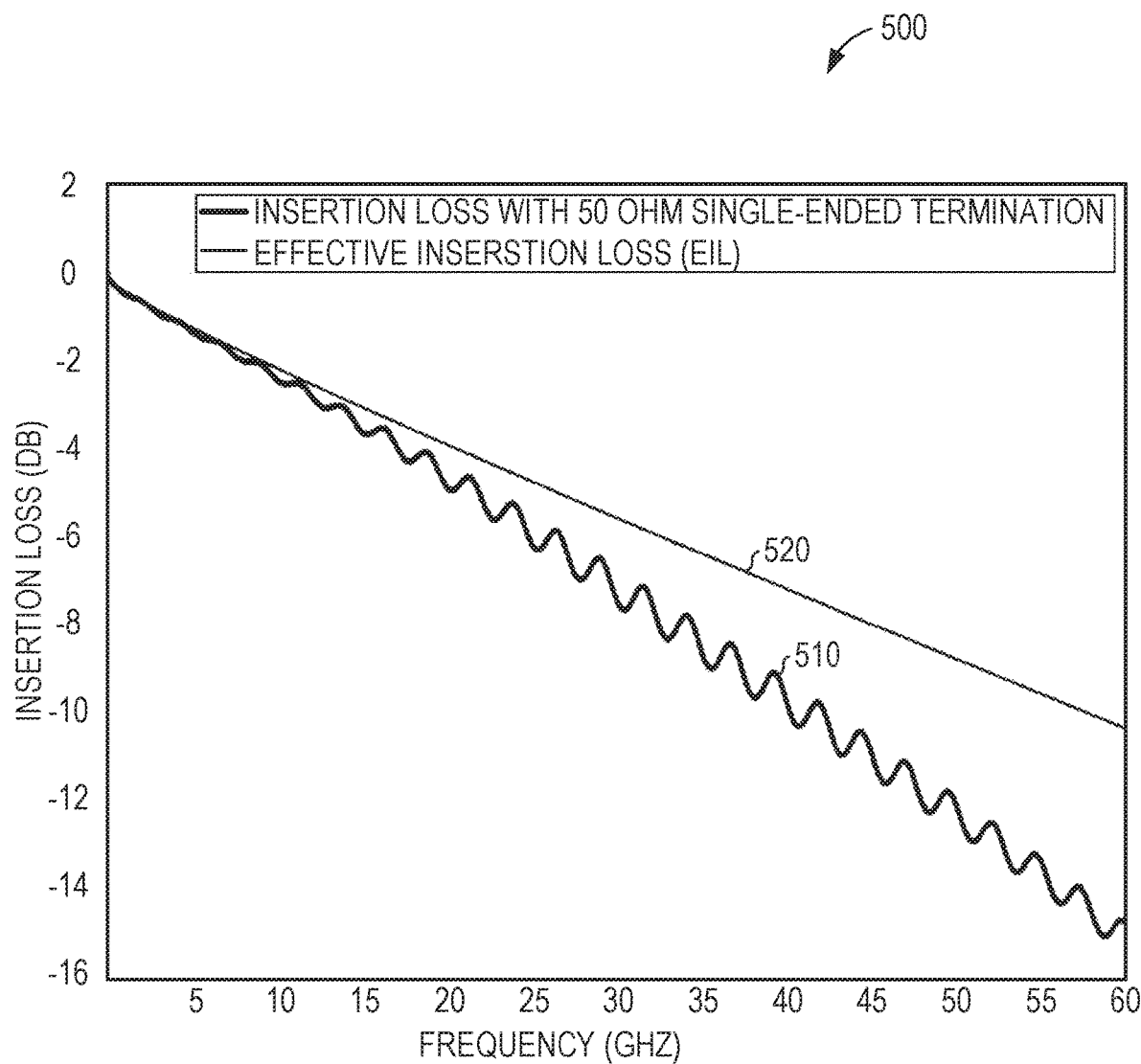
FIG. 5 is a graph showing loss as a function of frequency for an example network.

FIG. 5 is a graph 500 showing loss as a function of frequency for an example network. The graph 500 includes two plots, a plot 510 showing the insertion loss with a 50 ohm single-ended termination and a plot 520 showing the EIL of the network. Once the source and load reflection coefficients are determined using the methods 300 and 400, the EIL can be determined. The insertion loss with the unmatched 50 ohm load (or any unmatched load) is larger than the EIL, due to additional losses from reflections and re-reflections within the network. Thus, the methods 300 and 400 may be useful to interconnect designers in interpreting the impact of channel termination on signal quality through a network. The effective insertion loss noise is the difference between the plot 510 and the plot 520, and is a function of the load.

Figure 6:
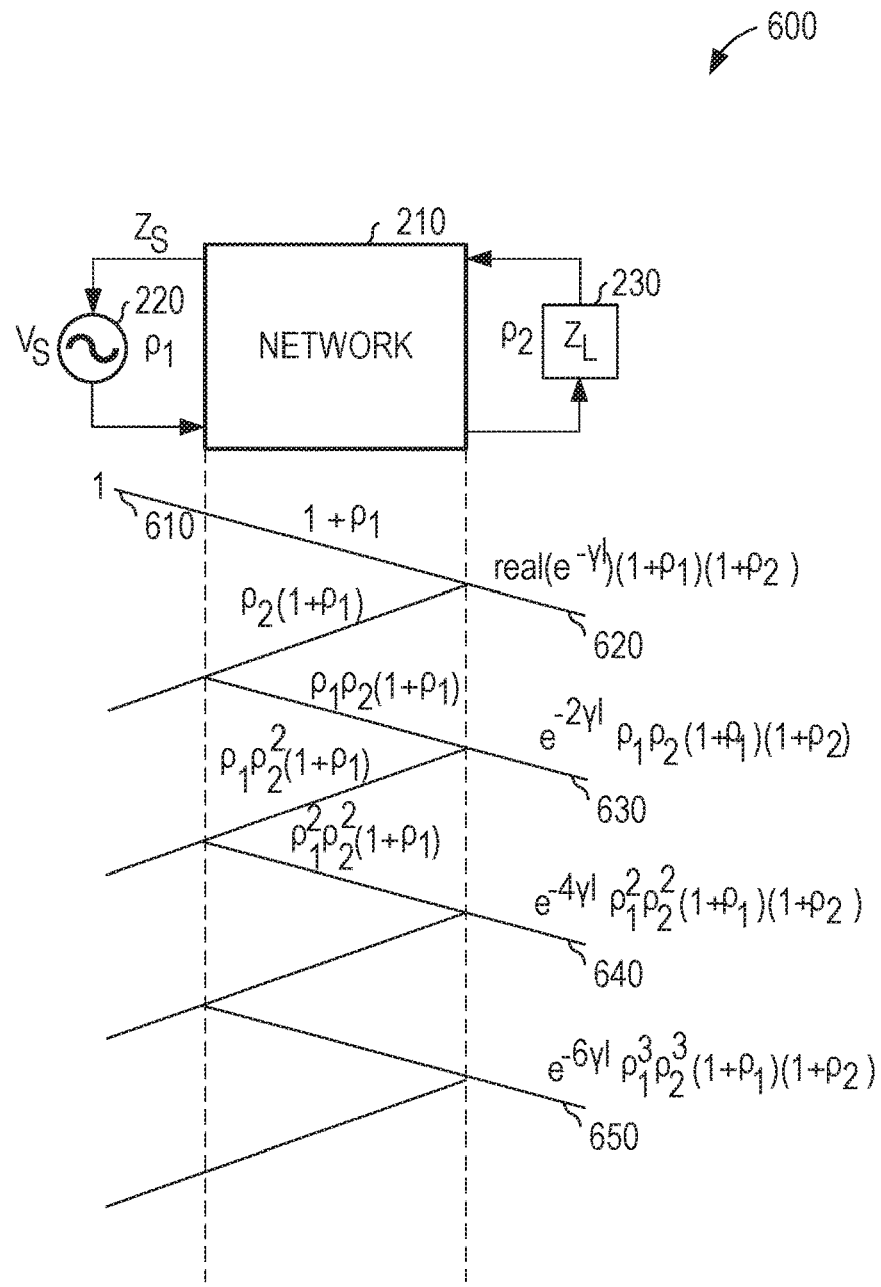
FIG. 6 is a conceptual drawing showing the reflections and re-reflections in an example network.

FIG. 6 is a conceptual drawing 600 showing the reflections and re-reflections in the network 210. The network 210 has the source 220 and the load 230, discussed above with respect to FIG. 2. The portion of the drawing 600 extending below the network 210 shows transmission of a signal from the source 220 to the load 230 along with reflections and re-reflections. The horizontal axis shows position within the network and the vertical axis represents time.

At position 610, a signal of unit strength is transmitted from the source 220. Due to the reflection coefficient $\rho_1$ of the source 220, the effective transmitted signal strength is $(1+\rho_1)$. Using $e^{-\gamma l}$ as the effective insertion loss, the strength of the initial signal received at the load 230, at position 620, is real$(e^{-\gamma l})(1+\rho_1)$ $(1+\rho_2)$. A portion of the signal that reaches the load end of the network 210 is not received at the load 230, but is instead reflected back to the source 220. This portion is given by the expression $\rho_2(1+\rho_1)$. A portion of the reflection is transmitted to the source 220 and a portion is re-reflected back to the load 230.

At operation 630, the re-reflection is received at the load 230, with strength $e^{-2\gamma l}$ $\rho_1$ $\rho_2$ $(1+\rho_1)$ $(1+\rho_2)$. The pattern of reflections and re-reflections continues, with the strength of each subsequent re-reflection diminishing. Thus, at position 640, the second re-reflection has strength $e^{-1\gamma l}$ $\rho_1^2$ $\rho_2^2$ $(1+\rho_1)$ $(1+\rho_2)$. And at position 650, the third re-reflection has strength $e^{-6\gamma l}$ $\rho_1^3$ $\rho_2^3$ $(1+\rho_1)$ $(1+\rho_2)$. The combined effect of the infinite series of re-reflections can be determined by taking the inverse fast Fourier transform (IFFT) of the infinite sum of re-reflections:

$$\text{IFFT}(\Sigma_{i=1}^{\infty} e^{-2i\gamma l} \rho_1^i \rho_2^i (1+\rho_1)(1+\rho_2)) \qquad \text{Equation 12:}$$

Figure 7:
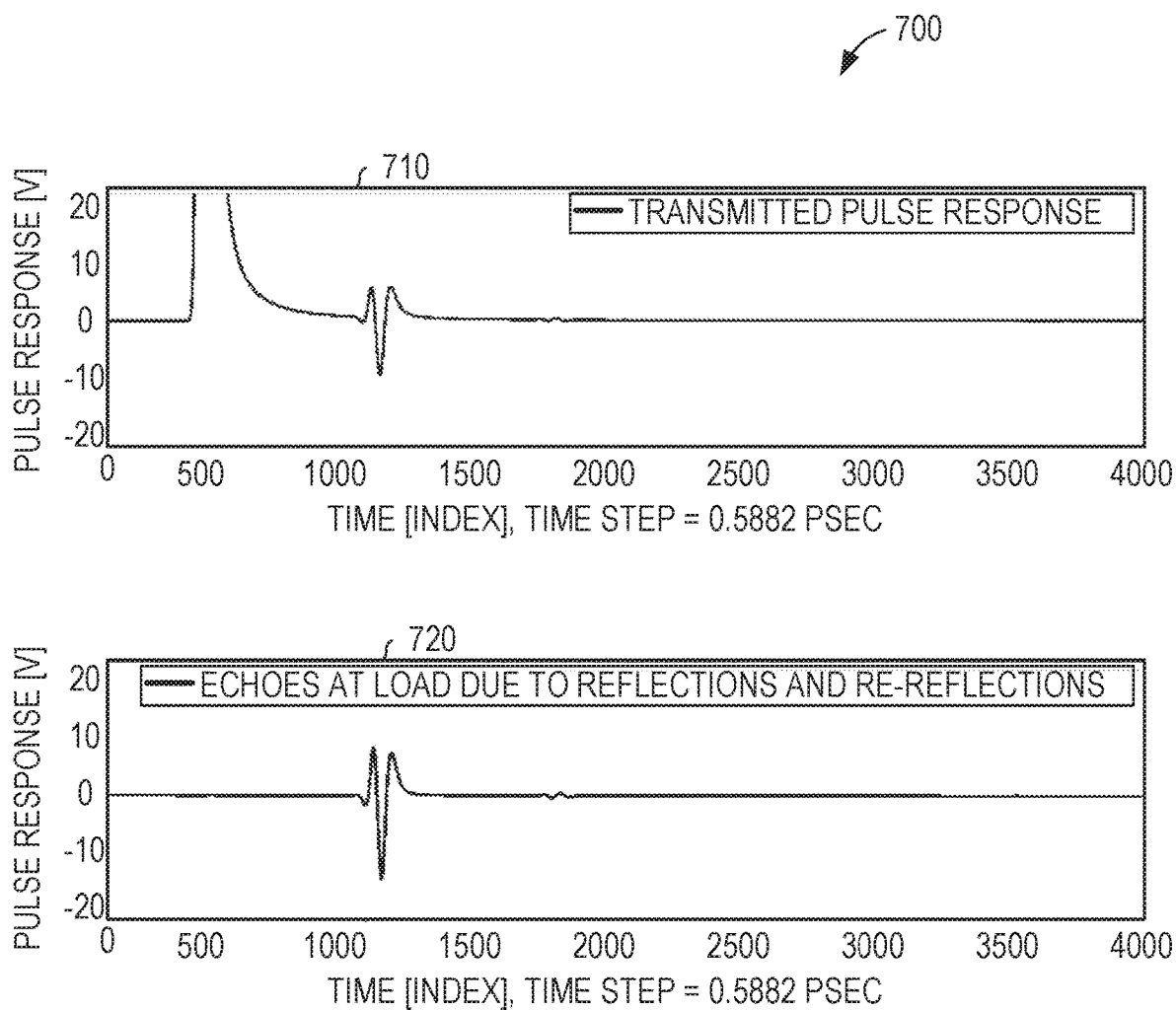
FIG. 7 is a pair of graphs showing a transmitted pulse response and echoes at the load due to reflections and re-reflections, according to some example embodiments.

FIG. 7 is a pair of graphs 710, showing a transmitted pulse response, and 720, showing echoes at the load due to reflections and re-reflections, according to some example embodiments. The graph 710 shows a substantial initial pulse response at about 500 index which translates to 294.1 picoseconds that declines thereafter. If there were no reflections and re-reflections, the response would smoothly asymptotically decline to zero. However, due to echoes at the load, a first perturbation is seen at about 1100 index which translates to 647.02 picoseconds and a second, smaller perturbation is seen at about 1700 index which translates to 999.94 picoseconds. This is consistent with the discussion of FIG. 6 above, describing how each subsequent re-reflection is smaller than the previous one. Logically, additional re-reflections are present, but the magnitude of those further reflections is too small to be seen on the graph 710. The graph 720 shows only the echoes at the load due to reflections and re-reflections, omitting the initial transmission pulse, inter-symbol interference (ISI), and other transmission losses. As a result, the perturbations near 1100 and 1700 index are greater in magnitude in the graph 720 than in the graph 710.

Figure 8:
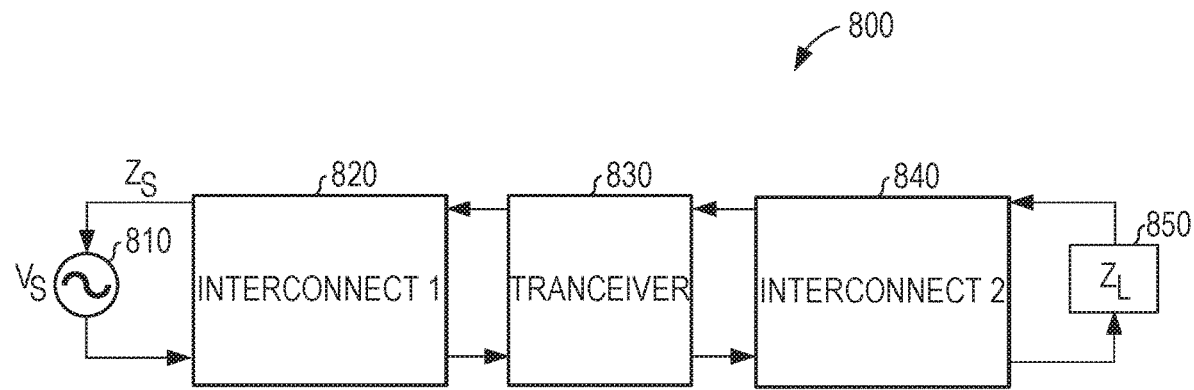
FIG. 8 is a high-level diagrammatic view of a network with a source, a load, and an intermediate transceiver that reduces reflections, according to some example embodiments.

FIG. 8 is a high-level diagrammatic view of a network 800 with a source 810, a load 850, and an intermediate transceiver 830 that reduces reflections, according to some example embodiments. The source 810 is connected to the transceiver 830 by the interconnect 820. The transceiver 830 is connected to the load 850 by the interconnect 840. The source 810 has a characteristic impedance $Z_S$. The load 850 has a characteristic impedance $Z_L$.

The transceiver 830 is configured to perform operations 310-340 of the method 300 and operations 410-440 of the method 400 to determine the source characteristic impedance and the load characteristic impedance. Based on the source characteristic impedance, the transceiver 830 modifies a receiving filter to compensate for reflections and re-reflections over the interconnect 820. For example, with reference to FIG. 7, a filter may have a set of coefficients (e.g., 100 coefficients) with each coefficient corresponding to a different time delay after receiving a signal of a predetermined magnitude. Continuing with this example, the graph 710 shows about 3500 indices after receipt of the initial pulse. With 100 coefficients, each coefficient spans 35 indices. The coefficient is multiplied by the initial signal (at 500 index) and added to the received signal during the time indices corresponding to the coefficient. In the graph 710, there is essentially no noise beyond 2000 index, so the coefficients for those time indices would be zero. At the minimum near 1200 index, the coefficient would have a positive value with a magnitude selected so that when the actual signal and the filter are combined, the net result is near zero. At the preceding and subsequent peaks, the coefficient would be negative, also with a magnitude selected so that when the actual signal and the filter are combined, the net result is near zero. In some example embodiments, filter coefficients set to zero may be disabled, saving power.

After compensating for the echoes at the transceiver 830 over the interconnect 820, the transceiver 830 transmits a new signal (also referred to as a "clean" signal because it lacks the noise of the original) to the load 850 over the interconnect 840. As compared to a connection between the source 810 and the load 850 without the transceiver 830, the network 800 allows for longer-distance communications. For example, if the transceiver 830 and the load 850 are each placed at the limit of clear communications beyond which line losses make communication impractical, the total distance between the source 810 and the load 850 is doubled while still allowing communication.

Using existing noise-correction methods in systems designed for long-reach communications, the systems fail when connected at short reach due to over-equalization. However, using the systems and methods described herein, which allow for dynamic measurement of line quality and noise due to reflections, the equalization can be tailored to the actual line conditions, allowing the same device to be used for both short-reach and long-reach communications.

Additionally or alternatively, the use of the transceiver 830 allows for lower-powered communications. For example, if the source 810 and the load 850 are kept at the same distance from each other when the transceiver 830 is added, the quality of the signal at the transceiver 830 is better than the quality of the original signal at the load 850. Accordingly, the power of the transmission signal from the source 810 can be reduced.

As still another advantage, the use of the transceiver 830 allows for higher-frequency communications. For example, if the source 810 and the load 850 are kept at the same distance from each other when the transceiver 830 is added and the power is kept the same, the ISI of data received at the transceiver 830 is lower than the quality of the original signal at the load 850. Accordingly, the frequency of the transmission signal from the source 810 can be increased.

Figure 9:
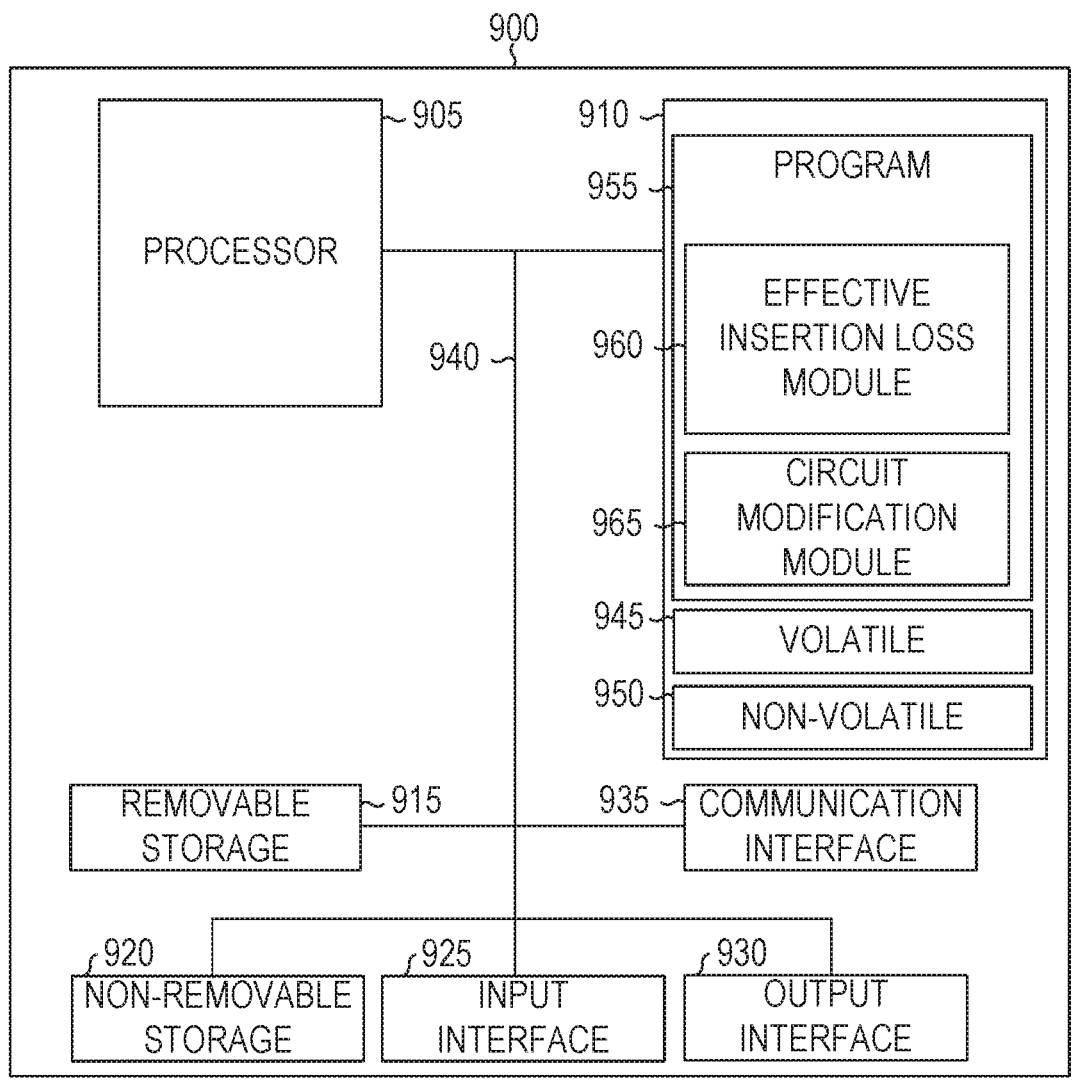
FIG. 9 is a block diagram illustrating components of a system for performing the methods described herein, according to some example embodiments.

FIG. 9 is a block diagram illustrating components of a system 900 for performing the methods described herein, according to some example embodiments. All components need not be used in various embodiments. For example, clients, servers, autonomous systems, and cloud-based network resources may each use a different set of components, or, in the case of servers, for example, larger storage devices.

One example computing device in the form of a computer 900 (also referred to as computing device 900 and computer system 900) may include a processor 905, memory storage 910, removable storage 915, and non-removable storage 920, all connected by a bus 940. Although the example computing device is illustrated and described as the computer 900, the computing device may be in different forms in different embodiments. For example, the computing device may instead be a smartphone, a tablet, a smartwatch, or another computing device including elements the same as or similar to those illustrated and described with regard to FIG. 9. Devices such as smartphones, tablets, and smartwatches are collectively referred to as "mobile devices." Further, although the various data storage elements are illustrated as part of the computer 900, the storage may also or alternatively include cloud-based storage accessible via a network, such as the Internet, or server-based storage.

The memory storage 910 may include volatile memory 945 and non-volatile memory 950 and may store a program 955. The computer 900 may include, or have access to, a computing environment that includes a variety of computer-readable media, such as the volatile memory 945; the non-volatile memory 950; the removable storage 915; and the non-removable storage 920. Computer storage includes random-access memory (RAM), read-only memory (ROM), erasable programmable read-only memory (EPROM) and electrically erasable programmable read-only memory (EEPROM), flash memory or other memory technologies, compact disc read-only memory (CD ROM), digital versatile disks (DVD) or other optical disk storage, magnetic cassettes, magnetic tape, magnetic disk storage or other magnetic storage devices, or any other medium capable of storing computer-readable instructions.

The computer 900 may include or have access to a computing environment that includes an input interface 925, an output interface 930, and a communication interface 935. The output interface 930 may interface to or include a display device, such as a touchscreen, that also may serve as an input device. The input interface 925 may interface to or include one or more of a touchscreen, a touchpad, a mouse, a keyboard, a camera, one or more device-specific buttons, one or more sensors integrated within or coupled via wired or wireless data connections to the computer 900, and other input devices. The computer 900 may operate in a networked environment using the communication interface 935 to connect to one or more remote computers, such as database servers. The remote computer may include a personal computer (PC), server, router, network PC, peer device or other common network node, or the like. The communication interface 935 may connect to a local-area network (LAN), a wide-area network (WAN), a cellular network, a WiFi network, a Bluetooth network, or other networks.

Computer instructions stored on a computer-readable medium (e.g., the program 955 stored in the memory storage 910) are executable by the processor 905 of the computer 900. A hard drive, CD-ROM, and RAM are some examples of articles including a non-transitory computer-readable medium such as a storage device. The terms "computer-readable medium" and "storage device" do not include carrier waves to the extent that carrier waves are deemed too transitory. "Computer-readable non-transitory media" includes all types of computer-readable media, including magnetic storage media, optical storage media, flash media, and solid-state storage media. It should be understood that software can be installed in and sold with a computer. Alternatively, the software can be obtained and loaded into the computer, including obtaining the software through a physical medium or distribution system, including, for example, from a server owned by the software creator or from a server not owned but used by the software creator. The software can be stored on a server for distribution over the Internet, for example.

The program 955 is shown as including an effective insertion loss module 960 and a circuit modification module 965. Any one or more of the modules described herein may be implemented using hardware (e.g., a processor of a machine, an ASIC, an FPGA, or any suitable combination thereof). Moreover, any two or more of these modules may be combined into a single module, and the functions described herein for a single module may be subdivided among multiple modules. Furthermore, according to various example embodiments, modules described herein as being implemented within a single machine, database, or device may be distributed across multiple machines, databases, or devices.

The effective insertion loss module 960 determines the effective insertion loss of a network using the methods described herein. The effective insertion loss module 960 may also use the method 600 and the method 700 to determine the source and load characteristic impedances.

The circuit modification module 965 determines a circuit modification to be made based on the effective insertion loss, the source characteristic impedance, the load characteristic impedance, or any suitable combination thereof. In some example embodiments, the determined circuit modification is automatically applied to the circuit (e.g., by adjusting an electronically controllable impedance, adjusting an operating frequency, adjusting an operating voltage, or any suitable combination thereof).

The Abstract of the Disclosure is provided to comply with 37 C.F.R. § 1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method comprising:
   accessing, by one or more processors, an S-parameter for a network that comprises a source;
   determining, based on reducing a source reflection of the network to zero through S-parameter renormalization, a first possible source reflection coefficient of the source of the network and a second possible source reflection coefficient of the source of the network, the first possible source reflection coefficient having a first magnitude greater than one, the second possible source reflection coefficient having a second magnitude less than or equal to one;
   selecting, by the one or more processors, the second possible source reflection coefficient as a source reflection coefficient based on the second magnitude being less than or equal to one;
   based on the source reflection coefficient, determining a source characteristic impedance at the source of the network; and
   modifying a circuit parameter based on the source characteristic impedance.

2. The method of claim 1, wherein:
   the network is a two-port network that comprises the source and a load;
   the method further comprises:
   determining, based on reducing a load reflection of the network to zero through S-parameter renormalization, a first possible load reflection coefficient of the load of the network and a second possible load reflection coefficient of the load of the network, the first possible load reflection coefficient having a third magnitude greater than one, the second possible load reflection coefficient having a fourth magnitude less than or equal to one;
   selecting, by the one or more processors, the second possible load reflection coefficient as a load reflection coefficient based on the fourth magnitude being less than or equal to one; and
   based on the source reflection coefficient and load reflection coefficient, determining a load characteristic impedance at the load of the network; and
   the modifying of the circuit parameter is further based on the load characteristic impedance.

3. The method of claim 1, further comprising:
   renormalizing the S-parameter based on the source characteristic impedance; and
   determining, based on the renormalized S-parameter, an effective insertion loss of the network as a function of frequency.

4. The method of claim 3, further comprising:
   determining, based on an insertion loss of the network and the effective insertion loss of the network, an effective insertion loss noise of the network.

5. The method of claim 3, further comprising:
   characterizing time domain reflections and re-reflections due to termination of the source based on an inverse fast Fourier transform of a function comprising a term for the effective insertion loss.

6. The method of claim 1, wherein:
   the accessing of the S-parameter comprises accessing the S-parameter from a vector network analyzer.

7. The method of claim 1, wherein:
   the modifying of the circuit parameter of the network based on the source characteristic impedance comprises adjusting an impedance of a component of the network based on the source characteristic impedance.

8. The method of claim 1, wherein:
   the modifying of the circuit parameter of the network based on the source characteristic impedance comprises adjusting an operating frequency of the network based on the source characteristic impedance.

9. The method of claim 1, wherein;
   the modifying of the circuit parameter of the network based on the source characteristic impedance comprises modifying a transceiver of the network based on the source characteristic impedance.

10. A system comprising:
a memory that stores instructions; and
one or more processors configured by the instructions to perform operations comprising:
accessing an S-parameter for a network that comprises a source;
determining, based on reducing a source reflection of the network to zero through S-parameter renormalization, a first possible source reflection coefficient of the source of the network and a second possible source reflection coefficient of the source of the network, the first possible source reflection coefficient having a first magnitude greater than one, the second possible source reflection coefficient having a second magnitude less than or equal to one;
selecting the second possible source reflection coefficient as a source reflection coefficient based on the second magnitude being less than or equal to one;
based on the source reflection coefficient, determining a source characteristic impedance at the source of the network; and
modifying a circuit parameter based on the source characteristic impedance.

11. The system of claim 10, wherein:
the network is a two-port network that comprises the source and a load;
the operations further comprise:
determining, based on reducing a load reflection of the network to zero through S-parameter renormalization, a first possible load reflection coefficient of the load of the network and a second possible load reflection coefficient of the load of the network, the first possible load reflection coefficient having a third magnitude greater than one, the second possible load reflection coefficient having a fourth magnitude less than or equal to one;
selecting, by the one or more processors, the second possible load reflection coefficient as a load reflection coefficient based on the fourth magnitude being less than or equal to one; and
based on the source reflection coefficient and load reflection coefficient, determining a load characteristic impedance at the load of the network; and
the determining of the source characteristic impedance is further based on the load reflection coefficient; and
the modifying of the circuit parameter is further based on the load characteristic impedance.

12. The system of claim 10, wherein the operations further comprise:
renormalizing the S-parameter based on the source characteristic impedance; and
determining, based on the renormalized S-parameter, an effective insertion loss of the network as a function of frequency.

13. The system of claim 12, wherein the operations further comprise:
determining, based on an insertion loss of the network and the effective insertion loss of the network, an effective insertion loss noise of the network.

14. The system of claim 12, wherein the operations further comprise:
characterizing time domain reflections and re-reflections due to termination of the source based on an inverse fast Fourier transform of a function comprising a term for the effective insertion loss.

15. The system of claim 10, wherein:
the accessing of the S-parameter comprises accessing the S-parameter from a vector network analyzer.

16. The system of claim 10, wherein:
the modifying of the circuit parameter of the network based on the source characteristic impedance comprises adjusting an impedance of a component of the network based on the source characteristic impedance.

17. The system of claim 10, wherein:
the modifying of the circuit parameter of the network based on the source characteristic impedance comprises adjusting an operating frequency of the network based on the source characteristic impedance.

18. A non-transitory machine-readable storage medium containing instructions that, when executed by one or more processors, cause the one or more processors to perform operations comprising:
accessing an S-parameter for a network that comprises a source;
determining, based on reducing a source reflection of the network to zero through S-parameter renormalization, a first possible source reflection coefficient of the source of the network and a second possible source reflection coefficient of the source of the network, the first possible source reflection coefficient having a first magnitude greater than one, the second possible source reflection coefficient having a second magnitude less than or equal to one;
selecting the second possible source reflection coefficient as a source reflection coefficient based on the second magnitude being less than or equal to one;
based on the source reflection coefficient, determining a source characteristic impedance at the source of the network; and
modifying a circuit parameter based on the source characteristic impedance.

19. The non-transitory machine-readable storage medium of claim 18, wherein:
the network is a two-port network that comprises the source and a load;
the operations further comprise:
determining, based on reducing a load reflection of the network to zero through S-parameter renormalization, a first possible load reflection coefficient of the load of the network and a second possible load reflection coefficient of the load of the network, the first possible load reflection coefficient having a third magnitude greater than one, the second possible load reflection coefficient having a fourth magnitude less than or equal to one;
selecting, by the one or more processors, the second possible load reflection coefficient as a load reflection coefficient based on the fourth magnitude being less than or equal to one; and
based on the source reflection coefficient and load reflection coefficient, determining a load characteristic impedance at the load of the network; and
the determining of the source characteristic impedance is further based on the load reflection coefficient; and
the modifying of the circuit parameter is further based on the load characteristic impedance.

20. The non-transitory machine-readable storage medium of claim 18, the operations further comprise:
renormalizing the S-parameter based on the source characteristic impedance; and determining, based on the renormalized S-parameter, an effective insertion loss of the network as a function of frequency.

\* \* \* \* \*